United States Patent [19]

Dunham

[11] 4,325,077

[45] Apr. 13, 1982

[54] AUTOMATIC WAFER ALIGNMENT SYSTEM

[75] Inventor: Richard M. Dunham, Merrimack, N.H.

[73] Assignee: GCA Corporation, Bedford, Mass.

[21] Appl. No.: 151,296

[22] Filed: May 19, 1980

[51] Int. Cl.³ .............................................. H04N 7/18
[52] U.S. Cl. ............................ 358/107; 340/146.3 H;
358/101; 364/515
[58] Field of Search ............... 358/107, 101; 364/515;
340/146.3 H

[56] References Cited

U.S. PATENT DOCUMENTS

| | | | |
|---|---|---|---|
| 3,216,311 | 11/1965 | Bibbero | 358/107 |
| 3,988,535 | 10/1976 | Hickman | 358/101 |
| 4,115,803 | 9/1978 | Morton | 358/107 |
| 4,186,412 | 1/1980 | Arimura | 358/107 |
| 4,203,132 | 5/1980 | Schmitt | 358/101 |

*Primary Examiner*—Howard Britton
*Attorney, Agent, or Firm*—Kenway & Jenney

[57] ABSTRACT

In the alignment system disclosed, herein a raster scanned video signal representing a selected portion of the wafer surface is analyzed for diagonal reference lines or features on the surface of the wafer utilizing a swept gating technique which extracts desired image features from an obscuring or noisy background. A given point on the wafer surface is determined by locating two oppositely-inclined diagonal features, the point being defined by their intersection. These two features are searched for simultaneously and independently, minimizing the search time.

15 Claims, 8 Drawing Figures

AUTOMATIC WAFER ALIGNMENT SYSTEM

BACKGROUND OF THE INVENTION

The present invention relates to an automatic wafer alignment system and more particularly to such a system which operates by locating pairs of oppositely-inclined diagonal features on the face of the wafer by analyzing a raster scanned video signal.

The present invention is adapted for accomplishing automatically a procedure which is heretofore been done manually. The procedure which has been automated is the alignment of a silicon wafer on an X-Y stage prior to the exposure of that wafer to produce a desired resist pattern. The resist pattern is used for subsequent processing as part of the semiconductor manufacturing procedure. While the system was developed particularly for use in conjunction with the projection exposure apparatus sold by the GCA Corporation of Bedford, Mass. under the trademark DSW Wafer Stepper, it should be understood that such alignment procedures are necessary with most resist exposing systems and that the present invention will be similarly useable with such systems.

In operation, the system of the present invention utilizes a raster scanned video signal obtained from a closed circuit television camera which sees the same image as would be seen by a manual operator of the system. Accordingly, adjustment and correlation of results between the manual and automatic systems methods is readily accomplished. This image is provided by a split-field microscope.

Alignment in both the manual and automatic modes is obtained when fiducial or reference marks on the silicon wafer are brought into alignment with corresponding indicia on a reticle in the microscope. The reticle is a reference point which is mechanically fixed within the system and which serves as the reference point for movement of the X-Y stage. It is a feature of the present invention that the final alignment of the wafer under automatic control is similarly with reference to the reticle and not to some position electronically established within the raster scan image. As is understood by those skilled in the art, the image of the reticle itself may shift within the video frame as the microscope is focused or due to some mechanical or electronic change in the closed circuit television apparatus.

SUMMARY OF THE INVENTION

In the preferred practice of the present invention, a wafer to be aligned by the system is provided with two spaced-apart fiducial marks, each of which comprises a pair of oppositely-inclined diagonal lines, i.e. an X-like mark. A well-defined point on the wafer surface is thus defined by the intersection of the lines constituting each pair. A reticle with which the wafer is to be aligned comprises a similar pair of marks, each again comprising a pair of oppositely-inclined diagonal lines. Each reticle portion and the corresponding feature on the wafer are viewed by a closed circuit television camera through the respective side of a split-field microscope, just as the operator views them in a manual system. The video signal is analyzed for diagonal features by a swept gate sampling system which extracts the desired image features from noise and irrelevant background information. The pair of intersecting lines which define a point on the wafer are searched for independently and simultaneously so that relatively fast feature acquisition is obtained by the electronic system.

For each diagonal feature being simultaneously located, a signal sampling means is operated by a timing means so as to sample portions of the video signal representing a first diagonal section through the image and to sample portions of the video signal representing a second diagonal section through the image and for providing a signal which is responsive to the difference between the amplitudes of the sections. The timing means also operates the sampling means to sample portions of the video signal representing a third and fourth diagonal section of the image, which third and fourth sections are parallel to and generally adjacent the first and second sections, respectively, and for providing a second signal which is responsive to the difference between the amplitudes of those sections. The timing means is responsive to a control signal for positioning the sections collectively within the image. Logic means are provided which are responsive to the first and second signals. The logic means includes means for scanning the control signal to sweep said sections collectively across the image in the absence of a parallel feature in the portion of the image traversed by the first and second sections and includes also servo means for varying the control signal in response to the first signal in a sense causing the first and second image sections to bracket a parallel feature in said image when the second signal indicates that a feature is traversed by said first and second sections.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
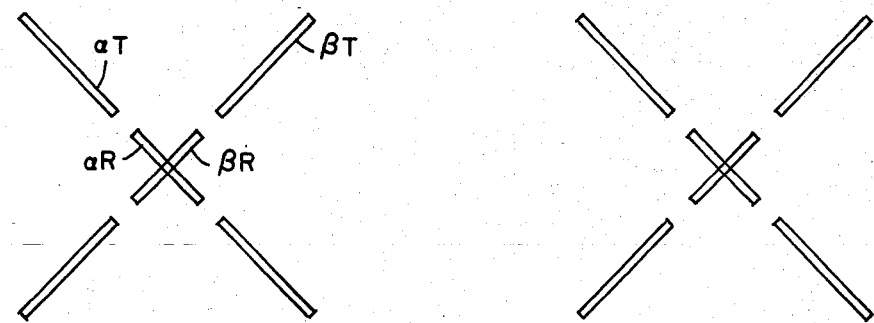
FIG. 1 is a diagram illustrating the view through a split field microscope showing reticle markings and fiducial markings of the type employed with the present invention, with the markings being in alignment.

As indicated previously, FIG. 1 represents the view seen through a split field microscope showing, in each half of the image, a superimposed reticle pattern and a corresponding fiducial marking on the wafer which is to be aligned. Both the reticle and the fiducial mark are X-like in the sense that each comprises a pair of oppositely-inclined diagonal lines. The reticle is a relatively small closed X, while the fiducial mark on the wafer is a comparatively large X with an open center into which the reticle image fits. For convenience in the following description, the angle of the left leaning line in each pair is designated alpha and the angle of the right leaning line in each pair is designated beta. Correspondingly, the reticle lines are designated alpha-R and beta-R and the corresponding two lines of the fiducial mark or a target are designated alpha-T and beta-T.

As indicated previously, alignment is obtained when each fiducial mark on the wafer is brought into registration with the respective reticle pattern. In typical wafer printing systems, such as the GCA apparatus referenced previously, the wafer is carried on X-Y stage which allows precise translational movement of the wafer and is mounted on the stage by means of a rotatable chuck which permits limited rotation of the wafer, relative to the stage, around an axis perpendicular to the face of the wafer. Typically, the wafer is translated to obtain registration of one fiducial mark with the corresponding reticle pattern and is rotated to obtain the best possible registration of the other pair. The rotational mounting is conventional designated a theta chuck.

In the practice of the present invention, a closed circuit television camera is employed to generate a raster scanned video signal based on the same image as that seen by an operator looking through the microscope. Features in the image are detected by analyzing that video signal. As will be understood by those skilled in the art, the time, within each raster line scan, when a given diagonal feature is traversed will vary as the raster scan traverses from top to bottom of each field. The apparatus of the present invention utilizes a scanned gate sampling technique to render the system highly sensitive to diagonal features occurring at the desired angle and relatively insensitive to rectilinear features of the type most commonly found in semiconductor wafer patterns. This swept gating is provided by the circuitry of FIGS. 4 and 5.

Figure 4:
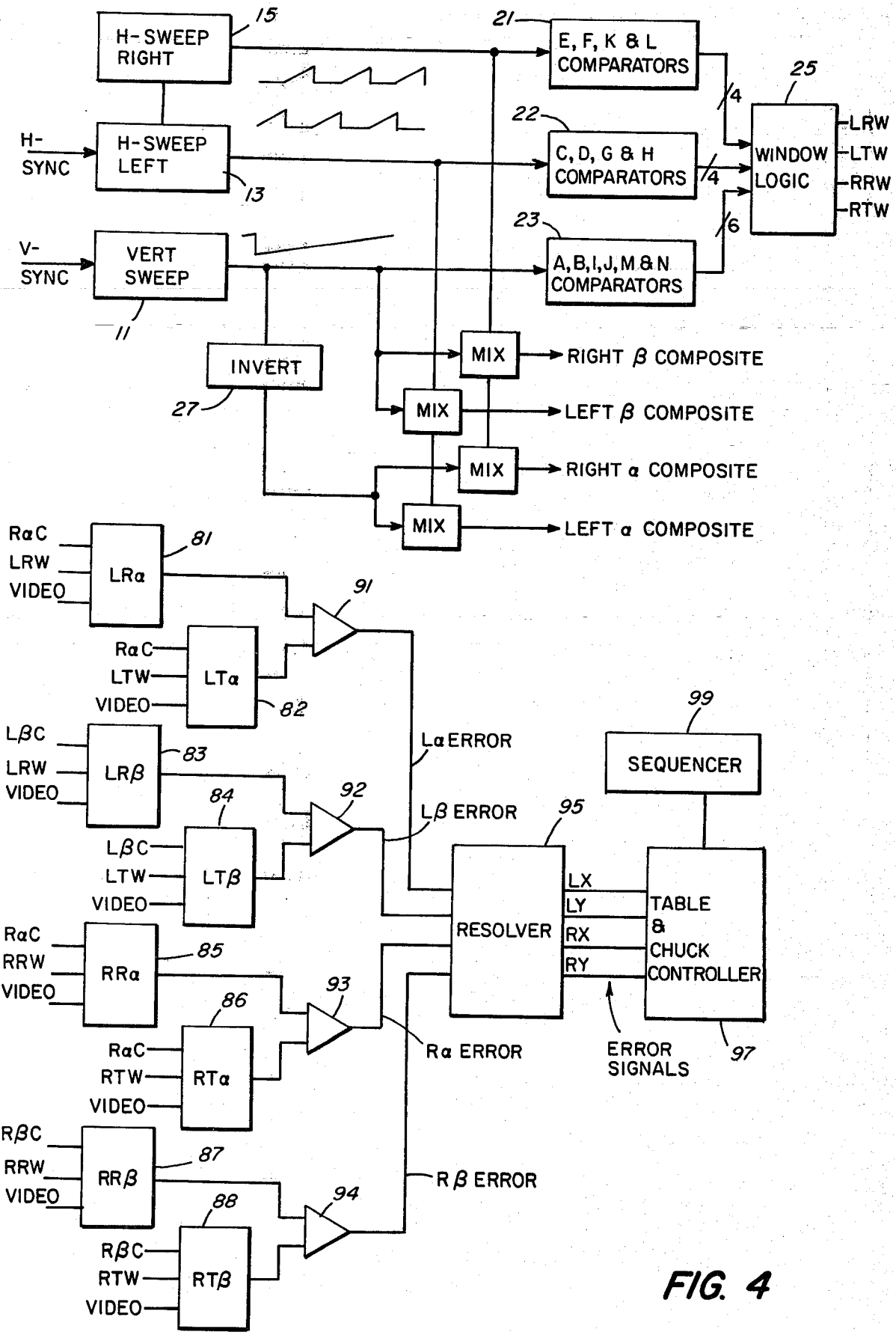
FIG. 4 is an overall block diagram of an automatic wafer alignment system constructed in accordance with the present invention.

With reference to FIG. 4, the system illustrated there utilizes the horizontal and vertical sync signals obtained from a closed circuit television camera to initiate independently generated vertical and horizontal sweep signals in a pattern somewhat different than those typically found in the camera itself. While the vertical sweep generator generates an essentially conventional sawtooth waveform, i.e. a waveform which provides one ramp for each frame of the television image, two separate horizontal sweep generating circuits 13 and 15 are provided, each of which provides a sweep voltage for one half of the image. The left hand sweep signal is triggered by the horizontal sync pulse, while the right hand horizontal sweep is triggered by the completion of the lefthand sweep, i.e. as indicated by the associated waveforms in FIG. 4.

Figure 3:
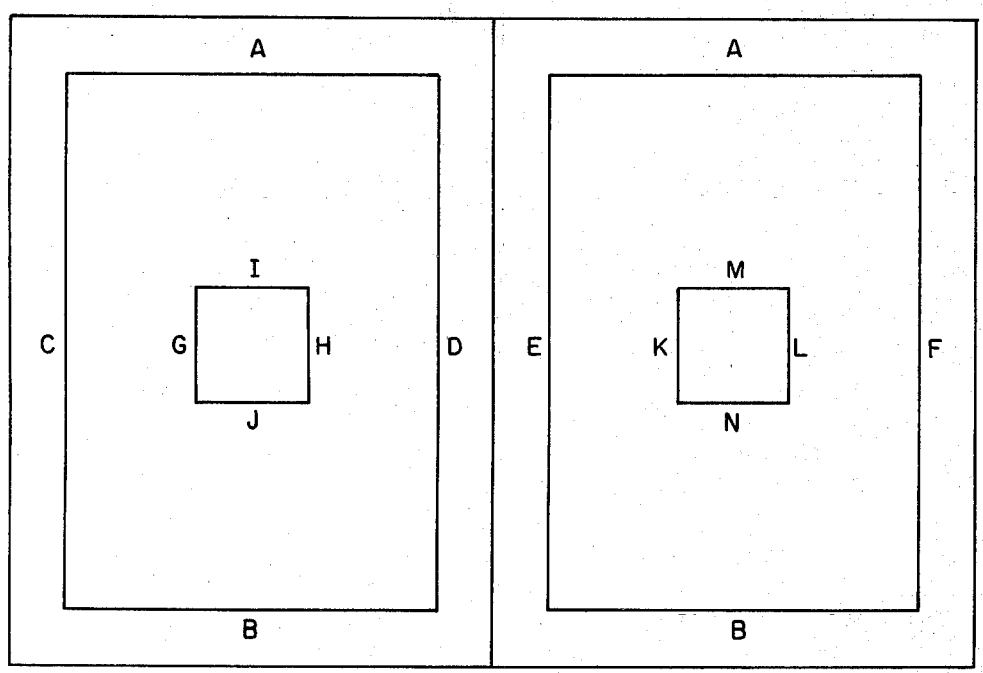
FIG. 3 is a diagram illustrating various zones or windows within a video image corresponding to the view through the split field microscope of FIGS. 1 and 2.

For analysis, the video image representing the view through the split field microscope is divided into multiple zones or windows corresponding to the features being looked for. The several zones and their boundaries are illustrated in FIG. 3. In the center of each portion of the field is the region in which the reticle image can be expected to appear, though its exact location will not be known due to various possible physical and electrical offset. In the lefthand field the reticle window is bounded by the lines G-H-I-J, whereas in the righthand field the window is bounded by line segments K-L-M-N. In order to ignore transient signals which might occur at the extremities of the field of view and at the juncture between the two fields, limited zones of consideration are also provided in which the fiducial marks on the wafer are sought. In the lefthand field the search zone is outlined by the line segments A-B-C-D and in the righthand field by the line segments A-B-E-F.

As will be understood by those skilled in the art, the determination of whether the instantaneous point of scan is to the right or left of a given vertical line can be determined by a comparator which determines when the horizontal scan voltage crosses a selected reference voltage corresponding to the lateral position of the given line. Likewise the determination of whether the instantaneous point of scan is above or below a given horizontal line can be made by a comparator responding to the vertical sweep signal on one hand and a reference voltage corresponding to the vertical height of the line. Comparators for determining the location of the instantaneous point of scan relative to each of the line segments of FIG. 3 are indicated at 21, 22 and 23 in FIG. 4. As indicated, the E, F, K and L comparators are responsive to the right hand horizontal sweep, the C, D, G and H comparators are responsive to the left hand horizontal sweep signal, and the A, B, I, J, M and N comparators are all responsive to the vertical sweep voltage. As will be understood, the logic signals obtained from the various comparators can be combined to determine whether the instantaneous scan position is or is not within a given window or zone at any given time. Such combinatorial logic is indicated at 25 in FIG. 4 and generates signals indicating when the beam is in left reticle window (LRW), the left target window (LTW), the right reticle window (RRW) or the right target window (RTW). The Boolean logic of the combinatorial array 25 is such that the target windows are exclusive of the reticle windows, that is, each fiducial mark or target is sought only in the region around the reticle window and inside of the outer border. An electronic switch operates to block the video signal from subsequent processing except when the scan is within the zones ABCD and ABEF.

In generating the timing signals necessary to diagonally scan the gating of samples from the video signal, the apparatus of the present invention utilizes a composite sweep signal made up of both horizontal and vertical sweep components. In that the left hand and right hand portions of the image are treated separately, both right and left composites are generated. In detecting image components at the angle alpha, both waveforms are used in their normal phase. However, to scan for image components at the angle beta, the vertical sweep waveform is inverted, as indicated at 27, before being mixed with the respective horizontal sweep waveform. Thus, as indicated in FIG. 4, four composite sweep signals are provided: the right alpha composite, the right beta composite, the left alpha composite, and the left beta composite.

As indicated previously, each of the two fiducial marks on the face of the wafer comprises two oppositely-inclined diagonal lines. Likewise, each of the reticles comprises two oppositely-inclined diagonal lines and, in order to provide an alignment which is wholly optically based and not predicated upon circuit parameters, each of the reticle lines is also individually sought out by the video analysis system.

Figure 5:
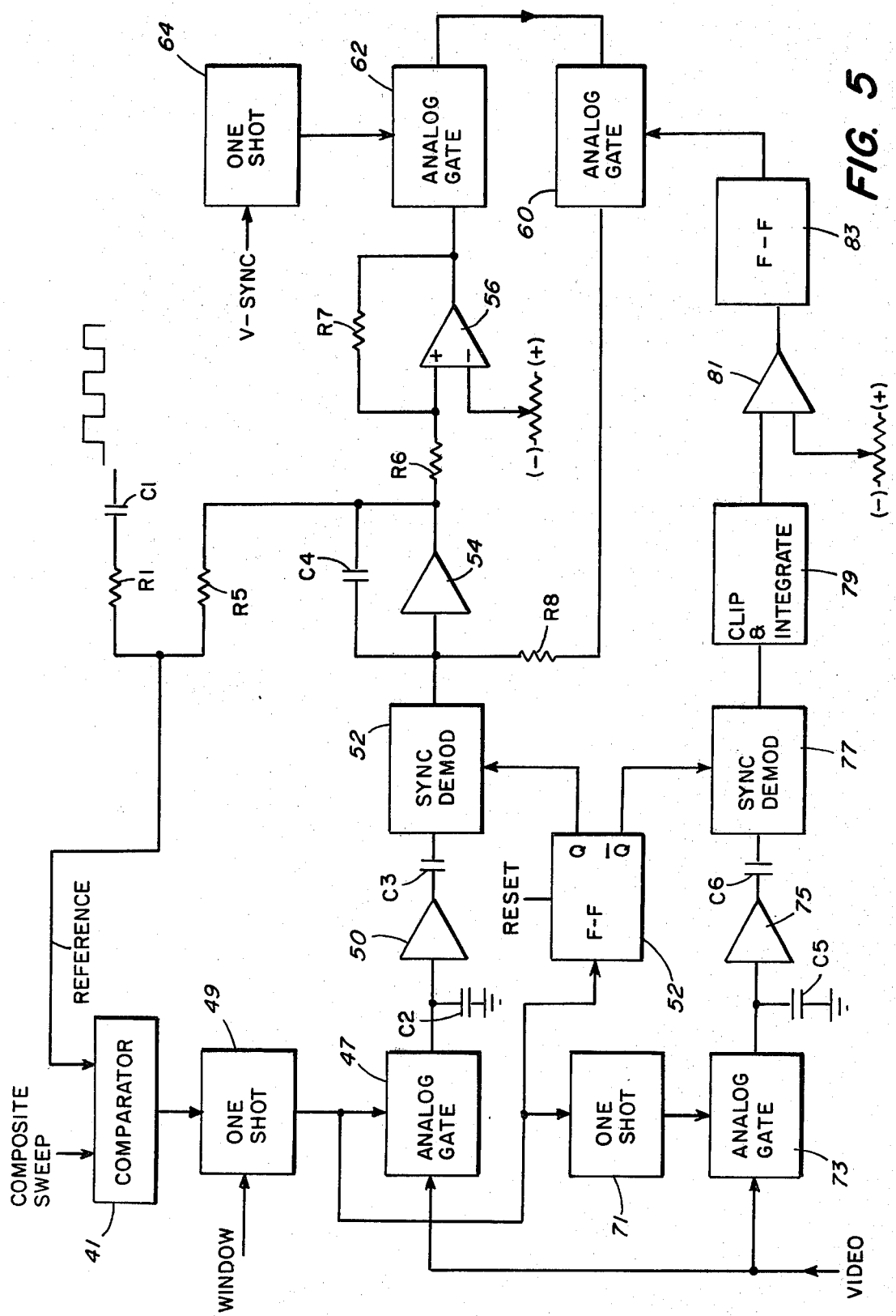
FIG. 5 is a block diagram of a video signal analyzer constructed in accordance with the present invention, eight of these analyzers being employed in the overall system of FIG. 4.

For the purpose of simultaneously searching out each of th eight line features in the overall video image, the apparatus illustrated in FIG. 4 utilizes eight of the individual processor units illustrated in FIG. 5. These are indicated by reference characters 81 through 88 in FIG.

4. Each of these circuits operates to analyze and seek out its particular feature from the overall video signal which is applied thereto as indicated. Respectively, the line elements which these eight circuits seek out are left reticle alpha, left target alpha, left reticle beta, left target beta, right reticle alpha, right target alpha, right reticle beta, and right target beta. As indicated in the diagram of FIG. 4, the appropriate composite raster signal is applied as an input to each of these circuits, as is the appropriate window signal which is employed to gate the video.

In each of the eight video processor units, a selected one of the composite sweep signals is applied to a comparator together with a controllable threshold voltage to generate the respective swept gate timing. It is important that the same composite sweep is applied to those processors dealing with corresponding features of target and reticle, i.e., alpha-target and alpha-reticle left, etc. The comparator is indicated by reference character 41 in the representative video processor unit shown in FIG. 5.

Figure 6:
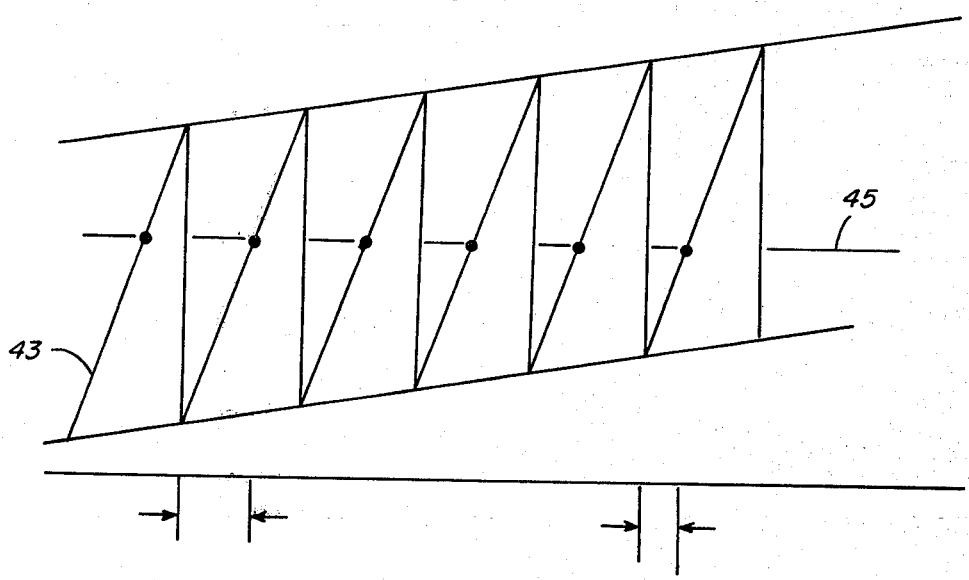
FIG. 6 is a timing and waveform diagram which serves in illustrating the operation of the circuitry of FIGS. 4 and 5.

The manner in which the composite sweep voltage is utilized for generating a swept timing appropriate for gating samples from the video signals is illustrated in FIG. 6. The composite sweep voltage is indicated by reference character 43 while the threshold level is indicated by reference character 45. As may be seen from this illustration, the effect of having the higher frequency, horizontal sawtooth waveform carried upwardly by the relatively slowly rising ramp of the vertical sweep voltage is to cause the time of intersection of the composite waveform with the threshold to occur earlier and earlier for each successive horizontal sweep. In this regard, it should be understood that the drawing of FIG. 6 is for illustration and that there has been a considerable exaggeration of scale as well as simplification of the waveform. The overall manner in which a shifting time or phase is obtained is, however, essentially correct. Likewise, it should be understood that while positive-going waveforms have been illustrated for ease of explanation, waveforms of either polarity may be used in any given implementation.

Figure 2:
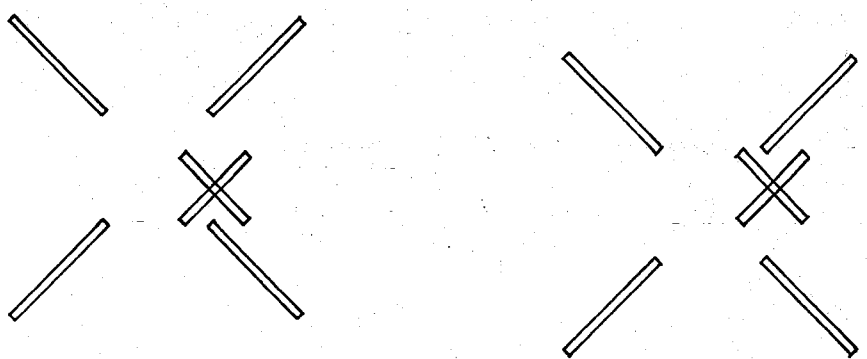
FIG. 2 is a similar view showing a slight misalignment.

Since, in FIG. 6, the intersection of these voltages occurs earlier in each horizontal scan as scan proceeds from top to bottom of the screen, it can be seen that this particular illustrative combination of waveforms is suitable for producing an angle of the beta type, that is a diagonal line leaning to the right as illustrated in FIGS. 1 and 2. By inverting the vertical waveform, however, it may be seen that the progression will occur in the opposite direction so that the timing is appropriate for correspondence with a feature at the angle alpha, i.e. a line leaning to the left as viewed in FIGS. 1 and 2. As will also be understood by those skilled in the art, the relative amplitudes of the horizontal and vertical components in the composite will determine the actual angle at which sampling is performed in the image and thus this angle can be adjusted by adjusting these relative amplitudes. While a nominal forty-five degrees from vertical is presently preferred in the practice of the invention, it should be understood that a wide range of angles may be accommodated and that the actual point at which it is desired to locate on the wafer surface will be accurately determined so long as the two inclined lines intersect at a reasonable angle.

As suggested previously, sampling takes place when the composite sweep signal reaches the threshold or reference voltage applied to comparator 41. Actual sampling is performed by an analog gate circuit 47 which selectively connects the video signal to a capacitor C2. The gate circuit 47 is controlled by a one-shot multivibrator 49, the multivibrator being triggered by the comparator 41. The one-shot multivibrator determines the interval over which the gate 47 is closed, typically 0.15 microsecond. The time constant formed by capacitor C2 with its charging circuit is comparable to the time the gate circuit is closed. Thus, after the switch is opened, the capacitor is charged to a voltage which is approximately proportional to the overall level of video during the time the gate is closed. The a.c. component of the voltage on capacitor C2 is applied to a bandpass amplifier 50 which is principally responsive to signal components at one-half the line repetition rate.

As indicated previously, each of the video processors operates to analyze the video signal only when the instantaneous scan position is within the respective window region. This constraint is exercised in each processor by applying the appropriate window signal to hold the multivibrator 49 in a reset condition when the scan is outside the window.

While the gradual raising of the horizontal sawtooth voltage by the vertical ramp provides a time scanning within each video frame, as explained previously, it can also be seen that varying the threshold voltage 45 will also cause a right/left shift in the overall position of the section being sampled. This reference voltage, applied to the other input of the comparator 41, thus provides a mechanism for positioning the sample section within the image window.

In order to facilitate the operation of a servo control loop which will cause the system to lock onto a diagonal feature when located, sampling is also performed on a second diagonal section which is parallel and closely adjacent to the first. As is described hereinafter, these sample sections are caused to straddle a diagonal image feature when "lock" is obtained. In relation to the nominal line scan interval, there is thus an "early" sample section and a "late" sample section. While separate sampling gates could be used for the early and late samples, the preferred embodiment uses the same analog gate 47 for both sets of samples, the sample values being in effect time multiplexed on the same channel, and integration is provided after demultiplexing or demodulation. In the preferred embodiment illustrated, the first and second sections are sampled on alternate horizontal lines of scan. To cause the lateral position of the sample taking to shift back and forth on alternate lines, a square wave component of one-half of the line scan frequency is added into the position signal which is applied as the reference potential to comparator 41. The square wave is supplied through a capacitor C1 and a resistor R1 as illustrated in FIG. 4.

Figure 7:
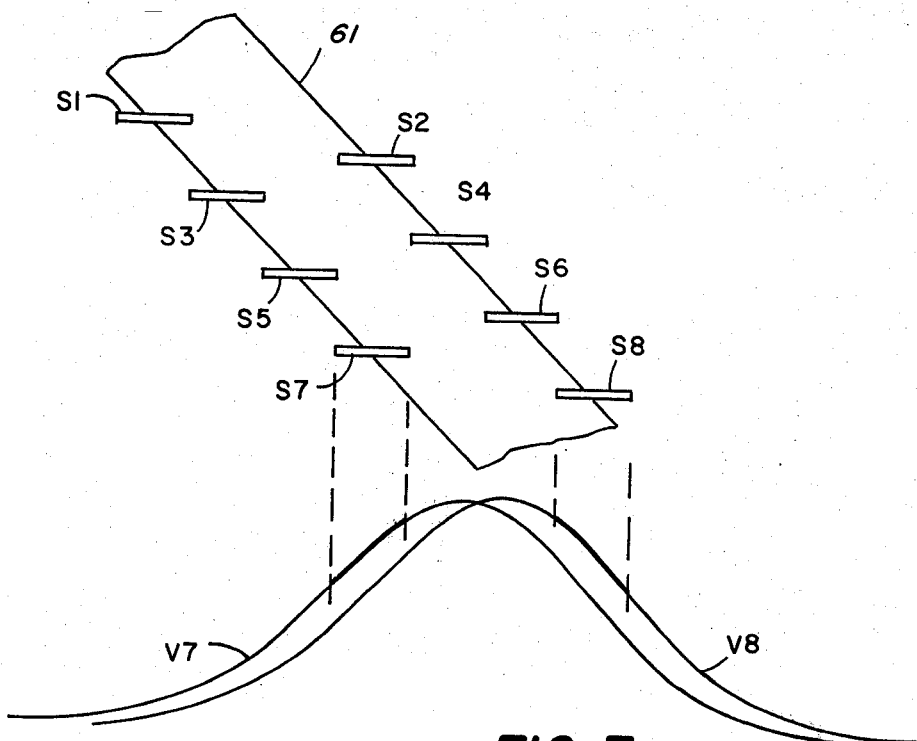
FIGS. 7 and 8 are a further timing and waveform diagrams which also aid in explaining the operation of the circuit of FIG. 5.

The effect of this line alternate shifting is illustrated in FIG. 7. In this figure it is assumed that the two sections being sampled just straddle a diagonal feature in the image, a situation which exists when capture has been achieved as described hereinafter. A diagonal feature in the image is indicated by reference character 61. A sample taken during a first line scan is indicated at S1, while a sample taken on the next (alternate) line is indicated at S2, the following sample being indicated at S3 and so forth. As may be seen, the odd number samples are taken along a section which is at the angle alpha and the even number samples are taken along a second section which is parallel and closely adjacent the first section. The separation between the two sections is a function of the amplitude of the square wave introduced and thus can be adjusted by varying that amplitude, for example, so as to allow for image features of different widths. As will be understood by those skilled in the semiconductor processing arts, feature widths may depend not only upon initial design parameters, but also upon subsequent processing.

As the television camera scan passes over the diagonal feature in the image on each horizontal scan, a signal pulse is generated. A representation of such a pulse is indicated at V7 in FIG. 7, the timing of the pulse being shown to correspond with the horizontal scan line during which the sample S7 was taken. Again, it should be understood that this waveform is idealized and the typical signal obtained in response to fiducial marks on the wafer surface may be quite varied as well as buried in noise. As illustrated, the sample S7 is taken during the rising portion of the waveform. The video pulse obtained on the next line scanned is represented by reference character V8 in FIG. 7, the corresponding sample S8 being taken during the backside of the pulse waveform. While the samples are taken on successive horizontal line scans, it can be seen that they effectively bracket the pulse and that successive samples in the same series, even or odd, will be similarly taken on the corresponding portion of the waveform, assuming the feature is parallel with the sampling section.

In this situation, i.e. with the sample sections parallel to and just straddling the image features, it can be seen that the average or integrated values of the two sets of samples will be equal. On the other hand, if the samples taken in the two sections did not exactly straddle the feature but were slightly early, it could be seen that the integrated value of the odd samples would be lower than that of the integrated value of the even numbered samples. It can thus be seen that the manner in which these sample values change will provide a basis for a servo loop which will lock onto a parallel feature in the image. While this description has been based upon a non-interlaced scan, an interlaced scan may also be used since timing is derived directly from the sweep voltage so that the contributions from successive frames will be cumulative.

As will be understood from FIG. 7 and the preceding description, the voltage appearing across C2 will be steady state d-c if the video during the early and late gates is equal. In the presence of typical random noise, the voltage on C2 will likewise be random noise. On the other hand, a feature having the proper angular alignment and positioned such that the resulting video pulse coincide with the early or the late gate positions, rather than being straddled thereby, will typically produce a series of square waves on C2. The frequency of these square waves is approximately one-half the horizontal sweep rate (actually one-half H±delta; where delta is a function of target angle, but always small compared to H, the horizontal sweep rate). The amplitude is proportional to the difference in video levels sampled by the early and late gates and the phase is 0° if the video level during the early gate is more positive, or 180° if it is more negative than the video level during the late gate. From this, it is apparent that early and late gates that perfectly straddle a video feature throughout its length produces only a d-c level, but any departure from a perfect straddle results in generation of a square wave of increasing amplitude and of a phase depending on sign of the delay differences. The increase in amplitude continues until the center of the video pulse corresponds with either the early or late gate, then decreases to zero when none of the video appears within either gate.

The amplified waveform derived from the sampling capacitor C2 is a.c. coupled, through a capacitor C3, to a synchronous demodulator or demultiplexer 52 which is driven by a signal at half the line scan frequency. Timing for this demodulation is obtained from a flip-flop 52 which is toggled essentially at the line scan frequency by the output signal from the one shot multi-vibrator 49. Proper phasing is obtained by resetting flip-flop 52 at the beginning of alternate horizontal sweeps. The system can be made responsive to light on dark features as well as dark on light features by reversing the phase of the control or reference signal which controls the flip-flop 52. This reversal in phase is conveniently implemented by changing the resetting of flip-flop 52 from the odd lines to the even lines, or visa versa, by means of a control panel switch. Controlling phasing in this manner allows the contrast polarity of the wafer feature to be changed independently of the reticle feature. As will be understood, reversing video polarity would not provide this independence. The output signal from the synchronous demodulator 52 is applied to an integrator 54 which, in effect, provides time domain averaging.

The output signal from the integrator 54 is applied back, through a mixing resistor R5, to control the d.c. level of the reference signal applied to the comparator 41. This d.c. signal path closes the control loop which causes the sampling system to lock on to an image feature which is parallel to the sample sections, when the two sections straddle the feature as illustrated in FIG. 7.

While the system described thus far is sufficient to maintain a servo lock of the sampling sections on the feature once the sections are in proper straddling position, the system also incorporates means for scanning the positions of the sections in order to seek out and obtain lock and to recognize when a sufficient signal is present to obtain capture. To effect scanning, the output signal from the integrator 54 is applied, through a resistor R6, to the non-inverting input of an operational amplifier 56. Positive feedback is provided around the amplifier through a resistor R7 and a suitable reference voltage is applied to the inverting input of this amplifier. The output signal from the amplifier 56 is in turn applied, through a pair of analog gates 60 and 62 and a mixing resistor R8, as another input to the integrator. When the gates 60 and 62 are closed, the integrator 54, together with the positive feedback amplifier 56, forms an unstable configuration of the type commonly used for triangle wave generation. In other words, when the loop is closed, the output voltage of the integrator would rise and fall linearly with a period determined by the various time constants involved. As described previously, the output signal from the integrator is also the position control signal which, by determining the reference potential provided to the comparator 41, controls the lateral positions of the diagonal sampling sections. However, as continuous variation of this control signal would cause a slight change in the effective angle of the sampling section, the gate 62 is closed only periodically, e.g. once a field, by the multi-vibrator 64. In this way, the section over which each set of samples is taken is effectively stepped across the image region, thereby to search for a parallel image feature.

Figure 8:
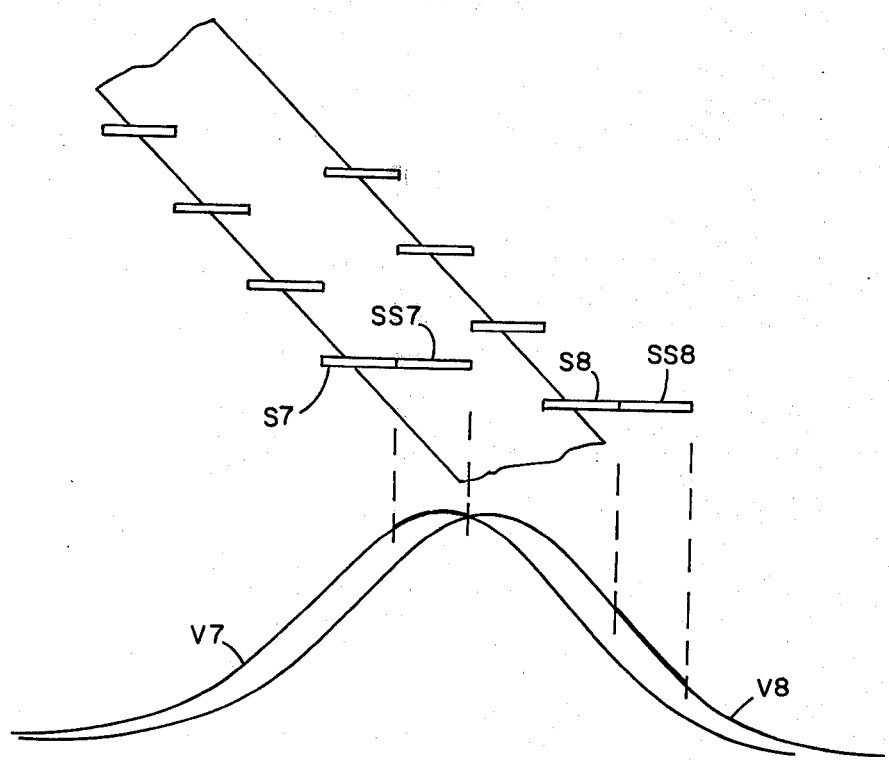

The preferred embodiment of the present invention also incorporates a second sampling channel which operates to disconnect the search function when a parallel image feature is detected. The output signal from the one shot multivibrator 49 is employed to trigger a second one shot multivibrator 71. This latter multivibrator in turn controls an analog gate 73 which is essentially identical to the gate 47 and which samples the same video signal. Similarly, the output from the sample gate 73 is applied to a storage capacitor C5 and the signal generated across the capacitor C5 is amplified, as indicated at 75, and synchronously demodulated as indicated at 77. As will be understood, the sections of the video image sampled by the gate 73 will undergo the same shifting on successive lines as the samples taken by the gate 47 but there will also be an additional steady offset, i.e. delay, due to the additional one shot 71. Being offset in time, these samples are not balanced when the system has locked on to a parallel feature. Rather, as illustrated in FIG. 8, where the waveforms V7 and V8 are essentially duplicated, the earlier sample, designated SS7, will be near the peak of the video pulse and the later sample, designated SS8, will be well down on the backside of the waveform. Accordingly, the signal output from the synchronous detector 77 detection will be near a maximum when the other two sampled sections are straddling the image feature.

The output signal from the detector 77 is clipped and integrated as indicated at 79 and then applied to comparator 81. An appropriate d.c. threshold voltage is applied to the other input of the comparator. The output signal from the comparator 81 is used to set a flip-flop 83 which in turn controls the gate 60. As indicated previously, gate 60 has the power to break the positive feedback loop which causes triangular wave scanning of the integrator 54. Thus, during scanning, if a parallel feature is encountered, and the scan sections move to a position where the samples taken by the gate 47 essentially bracket that feature, the integrated samples taken by the delayed sampling gate 73 will provide a signal indicating that a feature has been encountered and, through the operation of the comparator 81 which controls analog gate 60, the scanning loop will be broken. From this point then, the servo feedback loop can exert tight control over the position of the principal sampling sections, causing them to most precisely straddle the feature and yielding the most accurate possible measurement of its location.

As indicated previously, the output voltage of the integrator 54 provides an indication of the location of the sections being sampled within the image, and during scanning, this voltage follows a generally triangular waveform as the sample sections are swept back and forth across the image. Thus, when the scanning loop is broken and the feedback loop gains fine control over this integrator, the output of the integrator represents the feature position.

As will be understood, during the scanning process all of the parallel sections being sampled are scanned together across the image. It should likewise be understood that the lateral separation between these parallel sample sections is small as compared with the width of the overall video image or even any windowed portion thereof.

As will be understood from the prior description, each of the circuits 81-88 operates to generate a respective output signal which, once lock or capture is achieved, represents the position (X intercept) of the respective line element within the respective video window. The output signals from the analyzers 81-88 are compared in difference-taking operational amplifiers 91-94. In this regard, each signal representing a target feature location is paired with the respective reticle feature or line with which it is to be aligned. Thus, the output signals from the difference amplifiers 91-94 can be understood to constitute error signals, each representing the misalignment between the respective pair of lines. As will be understood, these error signals represent, in each case, the separation between parallel lines and this is true for both left hand leaning and right hand leaning lines.

In order to facilitate operation of the X-Y stage which is utilized to bring the wafer into exact alignment with the microscope reticle, the error signals are preferably applied to a resolver 95 which combines these error signals to provide a separate X-axis error and Y-axis error to left and right hand sides of the image. The transformations performed by the resolver involve merely adding, subtracting and scaling selected pairs of these signals.

The X-axis and Y-axis error signals are applied to a position controller 97 which operates the X-Y stage and the theta chuck. As will be understood, the particular controller employed will depend upon the type of device to which the wafer aligning system of the present invention is being interfaced. Many such position controller systems are known in the art which will respond to the error signals of the type provided by the present invention. Typically associated with the controller is a sequencer 99 which causes the operations of the aligner and the wafer printer to be coordinated. As is also understood, the sequencer may, for example, comprise a special purpose state machine or may be implemented by means of a general purpose, stored-program digital computer such as is often employed as an overall controller for such systems. In addition to the error signals to which the controller responds during automatic alignment in the practice of the present invention, preferably conventional manual signals are also provided to the controller, e.g. from a conventional joystick system, so that an operator can intervene if necessary. For example, if a poor pre-alignment causes the traditional mark on the wafer to fall completely outside the video field, it may be useful to have the operator move the X-Y stage in order to bring those features in the scan field.

In general, the sequence of operations is as follows. Once a wafer has been loaded onto the X-Y stage and mechanically pre-aligned as in conventional fashion, the scanning mode of the present invention is initiated. Each of the eight video processor elements 81-88 searches out the corresponding feature from the video image and locks on. As described previously, the output signal from each comparator 80 serves to indicate that lock or capture has been achieved and is employed to terminate the scanning operation in that element. These signals are also provided from each of the processor elements 81-88 to the sequencer so that it knows when all necessary features, target and reticle, have been located. In known manner, various timeout sequences and alarms may be sounded to initiate automatic or operator-controlled action if lock is not achieved in a suitable length of time.

Assuming all features are located, the sequencer enables the X-Y and theta controller which responds to the right hand X-axis and Y-axis error and left hand Y-axis signals to bring the fiducial marks on the face of the wafer into alignment with the right hand reticle. The theta controller responds to the Y axis error signal from the left hand side so as to reduce this error signal to an acceptable minimum. As is understood, the X axis error from the left hand side cannot be adjusted independently of the previously adjusted variables and may not closely approach zero if there has been some expansion or distortion of the wafer, i.e. so that the separation between the marks on the wafer does not exactly correspond to the separation of the reticles. While this X axis error on the left hand side cannot be corrected by the present invention, the value of this error can be provided to the wafer exposure system so that, if necessary, a scale factor may be introduced in the printing process in a manner which will compensate for this error and minimize cumulative effects as printing proceeds from one side of the wafer to the other.

Preferably, the X-Y stage control is performed as a two-step process, the stage being moved at a first relatively high speed when the error signal is above a certain level and then at a relative slow speed as the error signal comes below that threshold indicating that alignment is being approached. As is understood, this two-step slow approach yields a more accurate positioning and final alignment. Likewise, as the wafer approaches alignment, it may be desirable to reduce the size of the window area which is being analyzed since it is then known that the marks on the wafer surface are in a much more constrained area. Shrinking the window to this area, e.g. by moving the line segments A and B in FIG. 3 closer to the center of the respective portion of the area will reduce the amount of error contributed by features in the video signal from outside the area of interest.

In actual practice, a system constructed in accordance with the present invention has proved so sensitive to features having the designed angular orientation that locking on and automatic alignment can proceed if one-half of the fiducial line on the wafer extends into the appropriate window. Clearly, the signal from the synchronous demodulator 52 which drives the integrator 54 is weaker under such circumstance but if the sampled signal detected by the synchronous demodulator 77 is strong enough to disable the scanning procedure, the error signal will become more sensitive and the positioning more accurate as the X-Y table brings more of the line into the field of view. It may be noted that the target gates cannot lock onto reticle lines because the reticles are always inside windows where the target gates are disabled. While there is nothing to prevent a reticle gate from temporarily locking onto a target segment that happens to pass through the reticle window, this does not cause a problem. The X-Y motions will be approximately correct anyway until the open center of the target fiducial pattern starts to coincide with the reticle window. The reticle gate loses the fiducial pattern target, and then seeks out and locks onto the proper reticle segment, completing the alignment correctly.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. Apparatus for locating a diagonal feature in a video signal representing an image, said apparatus comprising:
    signal sampling means;
    timing means for operating said sampling means to sample portions of the video signal representing a first diagonal section through said image, and to sample portions of the video signal representing a second diagonal section through said image portion which second section is parallel to and closely adjacent said first section, and for providing a first signal responsive to the relative amplitudes of said samples, said timing means being also operative to operate said sampling means to sample portions of the video signal representing third and fourth diagonal sections of said image, which third and fourth sections are parallel to and generally adjacent said first and second sections respectively, and for providing a second signal which is responsive to the relative amplitudes of said third and fourth sections, said timing means being responsive to a control signal for positioning said four sections collectively within said image;
    logic means responsive to said first and second signals, said logic means including means for scanning said control signal to sweep said sections collectively across the image in the absence of a parallel feature in the portion of the image traversed by said first and second sections, and including also servo means for varying said control signal in response to said first signal in a sense causing said first and second image sections to bracket a parallel feature in said image when said second signal indicates a feature is traversed by said sections.

2. Apparatus for locating a diagonal feature in a raster scan video signal, the raster being in successive lines over a rectangular frame, said apparatus comprising:
    means for sampling said video signal;
    timing means for generating a sampling pulse on successive scans which is delayed by a predetermined amount within the line scan interval on alternate lines and which is shifted progressively in time within the line scan interval over the frame scan, said timing means being responsive to a control signal for adjusting the nominal time of sampling, the sampling pulses being applied to control said sampling gate;
    means for holding the samples passed by said gate;
    means for synchronously demodulating, at half the line scan rate the a.c. component of the held signal; and
    integrating means driven by said demodulator, the output signal from said integrating means being applied to said timing means as the control signal.

3. Apparatus as set forth in claim 2 further comprising means, including an amplifier, for selectively providing positive feedback around said integrating means thereby to sweep said control signal and cause sampling to be scanned across said frame.

4. Apparatus as set forth in claim 2 wherein said timing means includes:
    means for providing a vertical sweep signal and a horizontal sweep signal;
    means for generating a composite sweep signal which comprises a mixture of said vertical and horizontal sweep signals;
    a comparator responsive to the composite sweep signal and a reference voltage, said reference voltage being responsive to said control signal.

5. Apparatus for locating a diagonal feature in a raster scan video signal representing an image, the raster being in successive lines over a rectangular frame, said apparatus comprising:
- first gate means for sampling said video signal;
- timing means for generating a first sampling pulse on successive scans which is delayed by a predetermined amount within the line scan interval on alternate lines and which is shifted progressively in time within the line scan interval over the frame scan, said timing means being responsive to a control signal for adjusting the nominal time of sampling, the sampling pulses being applied to control said sampling gate;
- means for holding the samples passed by said first gate means;
- means for synchronously demodulating, at half the line scan rate, the a.c. component of the held signal; and
- integrating means driven by said demodulator; the output signal from said integrating means being applied to said timing means as the control signal;
- second gate means for sampling said video signal;
- means for delaying said first sampling pulse signal, the delayed signal being applied to control said second gate means
- means for holding the samples passed by said second gate means;
- means for synchronously demodulating, at half the line scan rate, the a.c. component of the held signal to generate a logic signal;
- logic means responsive to said logic signal, said logic means including means for scanning said control signal to sweep the sampled sections collectively across the image in one state of the logic signal and including also means for applying the output signal from said integrating means as said control signal when said logic signal in a second state of said logic signal which indicates a feature is traversed by the sampled sections.

6. Apparatus for locating features in a raster scanned video signal representing an image; said apparatus comprising:
- signal sampling means;
- timing means for operating said sampling means to sample portions of the video signal representing a first diagonal section through said image and to sample portions of the video signal representing a second diagonal section through said image portion which second section is parallel to and closely adjacent said first section;
- first discriminator means interconnected with said sampling means for providing a first signal responsive to the relative amplitudes of said samples, said timing means being responsive to a control signal for positioning said sections collectively within said image;
- first integrator means driven by said first discriminator means for generating a first control signal which is applied to said first timing means in a sense causing said first and second sections to bracket a parallel feature in said image;
- second signal sampling means;
- second timing means for operating said second sampling means to sample portions of the video signal representing a first complementary diagonal section through said image and to sample portions of the video signal representing a second complementary diagonal section through said image portion which second complementary section is parallel to and closely adjacent said first complementary section;
- second discriminator means interconnected with said second sampling means for providing a second signal responsive to the relative amplitudes of said complementary diagonal samples, said second timing means being responsive to a control signal for positioning said four sections collectively within said image;
- second integrator means driven by said second discriminator means for generating a second control signal which is applied to said second timing means in a sense causing said first and second complementary sections to bracket a parallel feature in said image,
- whereby the resultant values of said simultaneously obtained control signals represent the positions of interacting features in said image.

7. Apparatus as set forth in claim 6 further comprising means, including a respective amplifier, for selectively providing positive feedback around each of said integrator means thereby to sweep the respective control signal and cause sampling to be scanned across the image.

8. Apparatus as set forth in claim 6 wherein said apparatus includes:
- means for providing a vertical sweep signal and a horizontal sweep signal; and
- means for generating a composite sweep signal which comprises a mixture of said vertical and horizontal sweep signals;
- and wherein each of said timing means includes a comparator responsive to the composite sweep signal and a reference voltage, each reference voltage being responsive to the respective control signal.

9. Apparatus for locating an X-like fiducial mark on the surface of a wafer using a raster scanned video signal representing the surface, said apparatus comprising a pair of video processors each of which comprises:
- signal sampling means;
- timing means for operating said sampling means to sample portions of the video signal representing a first diagonal section through said image, and to sample portions of the video signal representing a second diagonal section through said image portion which second section is parallel to and closely adjacent said first section, and for providing a first signal responsive to the relative amplitudes of said samples, said timing means being also operative to operate said sampling means to sample portions of the video signal representing the third and fourth diagonal sections of said image which third and fourth sections are parallel to and generally adjacent said first and second sections respectively and for providing a second signal which is responsive to the relative amplitudes of said third and fourth sections, said timing means being responsive to a control signal for positioning said four sections collectively within said image;
- logic means responsive to said first and second signals, said logic means including means for scanning said control signal to sweep said sections collectively across the image in the absence of a parallel feature in the portion of the image traversed by said first and second sections, and including also servo means for varying said control signal in response to said first signal in a sense causing said first and second image sections to bracket a parallel feature in said image when said second signal indicates a feature is traversed by said sections;

the sections sampled by the two processors being oppositely inclined, whereby the values of the rspective first signals represent the location of the fiducial mark when both processors have bracketed the respective image feature as indicated by the respective second signals.

10. Apparatus for aligning an X-like fiducial mark on the surface of a semiconductor wafer with an X-like reticle provided by a microscope through which the wafer is viewed, the wafer being mounted on a movable stage; said apparatus comprising:

a raster scan television camera for providing a video signal representing the view through the microscope;

a pair of video processors for detecting left-leaning image features and a pair of video processors for detecting right-leaning image features, the portion of the field of view being considered by one of the processors in each pair being constrained to the region in which the fiducial mark is expected to be found with the other in each pair being constrained to the portion of the field of view in which the reticle is expected, each of the four processors comprising:

means for sampling said video signal;

timing means for generating a sampling pulse on successive scans which is delayed by a predetermined amount within the line scan interval on alternate lines and which is shifted progressively in time within the line scan interval over the frame scan, said timing means being responsive to a control signal for adjusting the nominal time of sampling, the sampling pulses being applied to control said sampling gate;

means for holding the samples passed by said gate;

means for synchronously demodulating, at half the line scan rate the a.c. component of the held signal; and integrating means driven by said demodulator, the output signal from said integrating means being applied to said timing means as the control signal;

servo control means responsive to the control signals generated by the four processors for moving said stage so as to null the difference between the control signals generated by the processors responsive to left-leaning image features and to null the difference between the control signals generated by the processors responsive to right-leaning image features, thereby to bring the fiducial mark into optical alignment with the reticle.

11. Apparatus for locating a diagonal feature in an image; said apparatus comprising:

a raster scan television camera for providing a video signal representing the image;

means for providing a vertical sweep signal and a horizontal sweep signal;

means for generating a composite sweep signal which comprises a mixture of said vertical and horizontal sweep signals;

video signal sampling means;

timing means, including a comparator responsive to said composite sweep signal and a respective control voltage which includes a square-wave component at half line scan frequency, for generating a timing signal for operating said first sampling means to sample portions of the video signal representing a first diagonal section through said image and to sample portions of the video signal representing a second diagonal section through said image portion which second section is parallel to and closely adjacent said first section;

discriminator means interconnected with said first sampling means for providing a first signal responsive to the relative amplitudes of said samples, said timing means being responsive to a control signal for positioning said sections collectively within said image; and integrator means driven by said discriminator means for generating a control signal which is applied to said timing means in a sense causing said first and second sections to bracket a parallel feature in said image.

12. Apparatus as set forth in claim 11 further comprising means, including an amplifier, for selectively providing positive feedback around said integrator means thereby to sweep said control signal and cause sampling to be scanned across said image.

13. Apparatus for locating a diagonal feature in an image; said apparatus comprising:

a raster scan television camera for providing a video signal representing the image;

means for providing a vertical sweep signal and a horizontal sweep signal;

means for generating a composite sweep signal which comprises a mixture of said vertical and horizontal sweep signals;

first video signal sampling means;

timing means, including a comparator responsive to said composite sweep signal and a respective control voltage which includes a square-wave component at half line scan frequency, for generating a timing signal for operating said first sampling means to sample portions of the video signal representing a first diagonal section through said image and to sample portions of the video signal representing a second diagonal section through said image portion which second section is parallel to and closely adjacent said first section;

first discriminator means interconnected with said first sampling means for providing a signal responsive to the relative amplitudes of said samples, said timing means being responsive to a control signal for positioning said sections collectively within said image;

first integrator means driven by said first discriminator means for generating a first signal;

second sampling means;

means for delaying said timing signal and operating said second sampling means in response to the delayed timing signal to sample portions of the video signal representing a third diagonal section through said image and to sample portions of the video signal representing a fourth diagonal section through said image portion which third and fourth seconds are parallel to said first and second sections;

second discriminator means interconnected with said second sampling means for providing a second signal responsive to the relative amplitudes of said third and fourth diagonal samples, logic means responsive to said first and second signals, said logic means including means for scanning said control signal to sweep said sections collectively across the image in the absence of a parallel feature in the portion of the image traversed by said first and second sections, and including also servo means for varying said control signal in response to said first signal in a sense causing said first and second image sections to bracket a parallel feature in said image when said second signal indicates a feature is traversed by said sections.

14. Apparatus for aligning an X-like fiducial mark on the surface of a semiconductor wafer with an X-like reticle provided by a microscope through which the wafer is viewed, the wafer being mounted on a movable stage; said apparatus comprising:

a raster scan television camera for providing a video signal representing the view through the microscope;

means for providing a vertical sweep signal and a horizontal sweep signal;

means for generating a first composite sweep signal which comprises a mixture of said vertical and horizontal sweep signals;

means for generating a second composite sweep signal which comprises a mixture, with one component inverted, of said vertical and horizontal sweep signals;

a pair of video signal processors responsive to left-leaning features, each processor including:

first signal sampling means;

first timing means, including a comparator responsive to said first composite sweep signal and a respective control voltage which includes a square-wave component at half line scan frequency, for generating a timing signal for operating said first sampling means to sample portions of the video signal representing a first diagonal section through said image and to sample portions of the video signal representing a second diagonal section through said image portion which second section is parallel to and closely adjacent said first section;

first discriminator means interconnected with said first sampling means for providing a first signal responsive to the relative amplitudes of said samples, said timing means being responsive to a control signal for positioning said sections collectively within said image;

first integrator means driven by said first discriminator means for generating a first control signal which is applied to said first timing means in a sense causing said first and second sections to bracket a parallel feature in said image;

a pair of video signal processors responsive to right-leaning features, each processor including:

second sampling means;

second timing means, including a comparator responsive to said second composite sweep signal and a respective control signal, which includes a square-wave component at half line scan frequency, for generating a timing signal for operating said second sampling means to sample portions of the video signal representing a first complementary diagonal section through said image and to sample portions of the video signal representing a second complementary diagonal section through said image portion which second complementary section is parallel to and closely adjacent said first complementary section;

second discriminator means interconnected with said second sampling means for providing a second signal responsive to the relative amplitudes of said complementary diagonal samples, said second timing means being responsive to a control signal for positioning said three sections collectively within said image;

second integrator means driven by said second discriminator means for generating a second control signal which is applied to said second timing means in a sense causing said first and second complementary sections to bracket a parallel feature in said image; and servo control means responsive to the control signals generated by the four processors for moving said stage so as to null the difference between the control signals generated by the processors responsive to left-leaning image features and to null the difference between the control signals generated by the processors responsive to right-leaning image features, thereby to bring the fiducial mark into optical alignment with the reticle.

15. Apparatus for locating a diagonal feature in a video signal representing an image, said apparatus comprising:

signal sampling means;

timing means for operating said sampling means to sample portions of the video signal representing a first diagonal section through said image, and to sample portions of the video signal representing a second diagonal section through said image portion which second section is parallel to and closely adjacent said first section, and for providing a first signal responsive to the relative amplitudes of said samples, said timing means being also operative to operate said sampling means to sample portions of the video signal representing a third diagonal section of said image, which third section is parallel to and between said first and second sections, and for providing a second signal which is responsive to the amplitudes of the sample video signal in said third section, said timing means being responsive to a control signal for positioning said sections collectively within said image;

logic means responsive to said first and second signals, said logic means including means for scanning said control signal to sweep said sections collectively across the image in the absence of a parallel feature in the portion of the image traversed by said first and second sections, and including also servo means for varying said control signal in response to said first signal in a sense causing said first and second image sections to bracket a parallel feature in said image when said second signal indicates a feature is traversed by said sections.

* * * * *